US006330636B1

(12) United States Patent
Bondurant et al.

(10) Patent No.: US 6,330,636 B1
(45) Date of Patent: Dec. 11, 2001

(54) DOUBLE DATA RATE SYNCHRONOUS DYNAMIC RANDOM ACCESS MEMORY DEVICE INCORPORATING A STATIC RAM CACHE PER MEMORY BANK

(75) Inventors: David W. Bondurant; Michael Peters; Kenneth J. Mobley, all of Colorado Springs, CO (US)

(73) Assignee: Enhanced Memory Systems, Inc., Colorado Springs, CO (US)

( * ) Notice: Subject to any disclaimer, the term of this patent is extended or adjusted under 35 U.S.C. 154(b) by 0 days.

(21) Appl. No.: 09/236,804

(22) Filed: Jan. 29, 1999

(51) Int. Cl.[7] .................................................. G06F 12/08

(52) U.S. Cl. ..................... 711/105; 711/101; 711/102; 711/103; 711/104; 711/150; 711/167; 711/168

(58) Field of Search ............................... 711/5, 101–105, 711/150; 365/193–201, 230.03, 233

(56) References Cited

U.S. PATENT DOCUMENTS

| 4,577,293 | 3/1986 | Matick et al. ................. 365/189.04 |
| 4,608,666 | 8/1986 | Uchida ............................... 365/222 |
| 4,725,945 | 2/1988 | Kronstadt et al. .................. 711/118 |
| 4,794,559 | 12/1988 | Greeberger ............................ 365/49 |
| 4,870,622 | 9/1989 | Aria et al. ..................... 365/230.02 |
| 4,894,770 | 1/1990 | Ward et al. ......................... 711/128 |
| 4,926,385 | 5/1990 | Fujishima et al. ............. 365/230.03 |
| 4,943,944 | 7/1990 | Sakui et al. .................... 365/189.05 |

(List continued on next page.)

FOREIGN PATENT DOCUMENTS

| 41 18 847A1 | 12/1991 | (DE) . |
| 60-258792 | 12/1985 | (JP) . |
| 63-81692 | 4/1988 | (JP) . |
| 1-159891 | 6/1989 | (JP) . |

OTHER PUBLICATIONS

"DM 2202 EDRAM 1Mb×4 Enchanced Dynamic RAM—Product Review," May 22, 1991, Ramtron, Colorado Springs, Colorado.
Sartore, "New Generation of Fast Enhanced DRAMS Replace Static RAM Caches in High–end PC Work Station" 1991.
Niijima et al, "QRAM—Quick Access Memory System", IEEE International Conference, pp. 417–420, Sep. 17, 1990.
Bursky, "Combination DRAM–SRAM Removes Secondary Caches", Electr. Design, vol. 40, No. 2, pp. 39–43, Jan. 23, 1992.
Goodman et al. "Use of Static Column RAM as a Memory Hierarchy," 11th Annual Symposium, IEEE, 1984, pp. 167–174.
Ohta et al., "A 1 MB DRAM with 33 MHz Serial I/O Ports" Digest of Technical Papers, 1986 IEEE, pp. 274–275 (1986).
Dosaka et al., "A 100MHz 4Mb Cache DRAM with Fast Copy–back Scheme," Digest of Technical Papers, 1992 IEEE International Solid–State Circuits Conference, p. 148–149 (6/92).

*Primary Examiner*—Than Nguyen
(74) *Attorney, Agent, or Firm*—William J. Kubida, Esq.; Peter J. Meza, Esq.; Kent Lembke, Esq.

(57) ABSTRACT

A double data rate ("DDR") synchronous dynamic random access memory ("SDRAM") device incorporating a static random access memory ("SRAM") cache per memory bank that provides effectively double peak data bandwidth, optimizes sustained bandwidth and improves bus efficiency as compared with conventional DDR SDRAM devices. The memory device disclosed provides effectively faster basic DRAM memory latency parameters, faster page "hit" latency, faster page "miss" latency and sustained bandwidth on random burst reads, faster read-to-write latency and write-to-read latency, hidden precharge, hidden bank activate latency, hidden refresh and hidden write precharge during a read "hit".

18 Claims, 5 Drawing Sheets

U.S. PATENT DOCUMENTS

| | | |
|---|---|---|
| 5,025,421 | 6/1991 | Cho .................................. 365/230.05 |
| 5,111,386 | 5/1992 | Fujishima et al. ................... 711/118 |
| 5,134,616 | 7/1992 | Barth, Jr. et al. .................... 714/711 |
| 5,148,396 | 9/1992 | Nakada et al. ................... 365/389.03 |
| 5,179,687 | 1/1993 | Hidaka et al. ....................... 711/118 |
| 5,184,320 | 2/1993 | Dye ........................................ 365/49 |
| 5,184,325 | 2/1993 | Lipovski ........................ 365/189.02 |
| 5,214,610 | 5/1993 | Houston ............................ 365/233.5 |
| 5,226,009 | 7/1993 | Arimoto .......................... 365/189.04 |
| 5,226,139 | 7/1993 | Fujishima et al. ....................... 711/3 |
| 5,226,147 | 7/1993 | Fujishima et al. ................... 711/118 |
| 5,249,282 | 9/1993 | Segers .................................. 711/122 |
| 5,305,280 | 4/1994 | Hayano .......................... 365/230.03 |
| 5,329,489 | 7/1994 | Diefendorff .................... 365/189.05 |
| 5,353,427 | 10/1994 | Fujishima et al. ................... 711/118 |
| 5,359,722 | 10/1994 | Chan et al. .......................... 713/600 |
| 5,381,370 | 1/1995 | Lacey et al. .................... 365/189.01 |
| 5,390,308 | 2/1995 | Ware et al. ............................... 711/5 |
| 5,404,338 | 4/1995 | Murai et al. ......................... 365/233 |
| 5,421,000 | 5/1995 | Fortino et al. ....................... 711/118 |
| 5,471,601 | 11/1995 | Gonzales ................................. 711/3 |
| 5,539,696 | 7/1996 | Patel .............................. 365/189.01 |
| 5,568,427 | 10/1996 | Takamae ........................ 365/189.02 |
| 5,600,605 | 2/1997 | Schaefer ............................... 365/233 |
| 5,627,791 | 5/1997 | Wright et al. ........................ 365/222 |
| 5,636,173 | 6/1997 | Schaefer .......................... 365/230.03 |
| 5,655,105 | 8/1997 | McLaury .............................. 711/169 |
| 5,666,321 | 9/1997 | Schaefer ........................... 365/233.5 |
| 5,673,233 | 9/1997 | Wright et al. ........................ 365/233 |
| 5,787,457 | * 7/1998 | Miller et al. ......................... 711/105 |
| 5,875,134 | * 2/1999 | Cloud ................................... 365/193 |
| 5,986,948 | * 11/1999 | Cloud ................................... 365/193 |
| 6,044,026 | * 3/2000 | Morgan ................................ 365/194 |
| 6,044,032 | * 3/2000 | Li .................................... 365/230.03 |
| 6,067,260 | * 5/2000 | Ooishi et al. ........................ 365/200 |
| 6,081,477 | * 6/2000 | Li .......................................... 365/233 |
| 6,104,650 | * 8/2000 | Shore ................................... 365/201 |
| 6,111,807 | * 8/2000 | Ooishi ............................ 365/230.01 |

* cited by examiner

| FIG. 4A | FIG. 4B |

FIG. 4B

DOUBLE DATA RATE SYNCHRONOUS DYNAMIC RANDOM ACCESS MEMORY DEVICE INCORPORATING A STATIC RAM CACHE PER MEMORY BANK

CROSS REFERENCE TO RELATED PATENT APPLICATIONS

The present invention is related to the subject matter disclosed in U.S. patent application Ser. No. 09/023,656 filed Feb. 9, 1998 for "Synchronous Dynamic Random Access Memory Device Incorporating a Static RAM Cache" assigned to Enhanced Memory Systems, Inc. (a subsidiary of Ramtron International Corporation, 1850 Ramtron Dr., Colorado Springs, Colo. 80921) and IBM Corporation, Armonk, N.Y., the disclosure of which is herein specifically incorporated by this reference.

BACKGROUND OF THE INVENTION

The present invention relates, in general, to the field of integrated circuit memory devices. More particularly, the present invention relates to a double data rate ("DDR") synchronous dynamic random access memory ("SDRAM") device which incorporates a static random access memory ("SRAM") cache per memory bank.

As the performance of computer central processing units ("CPUs") has increased dramatically in recent years, this performance improvement has far exceeded that of any corresponding increase in the performance of computer main memory. Typically, main memory has been made up of numbers of asynchronous DRAM integrated circuits and it was not until the introduction of faster SRAM cache memory that the performance of systems with DRAM main memory improved. This performance improvement was achieved by making a high speed locally-accessed copy of memory available to the CPU so that even during memory accesses, the CPU would not always need to operate at the slower speeds of the system bus and the main memory DRAM. This method of copying memory is referred to as "caching" a memory system and is a technique made possible by virtue of the fact that much of the CPU accesses to memory is directed at localized memory address regions. Once such a region is copied from main memory to the cache, the CPU can access the cache through many bus cycles before needing to refresh the cache with a new memory address region. This method of memory copying is advantageous in memory Read cycles which, in contrast to Write cycles, have been shown to constitute 90% of the external accesses' of the CPU.

As mentioned previously, the most popular hardware realization of a cache memory employs a separate high-speed SRAM cache component and a slower but less expensive DRAM component. A proprietary Enhanced DRAM (EDRAM®) integrated circuit memory device, developed by Enhanced Memory Systems, Inc., assignee of the present invention, integrates both of these memory elements on one chip along with on-chip tag maintenance circuitry to further enhance performance of computer main memory over separate SRAM and DRAM components. Details of the EDRAM device are disclosed and claimed in U.S. Pat. Nos.: 5,699,317 issued Dec. 16, 1997 and 5,721,862 issued Feb. 24, 1998, both assigned to Enhanced Memory Systems, Inc., the disclosures of which are specifically incorporated herein by this reference.

SDRAMs differ from earlier asynchronous DRAM devices by incorporating two or more memory banks per device and by providing a simple, synchronously clocked interface in lieu of separate asynchronous clocking and discrete row and column access control lines. These differences result in a relatively higher data bandwidth and potentially faster access times for computer main memory which is particularly important with current and anticipated memory intensive multimedia and graphics applications.

The DRAM industry has also developed a double data rate version of the synchronous DRAM that doubles the peak data rate of the SDRAM by clocking data on both edges of the clock. Double data rate SDRAMs utilize a bi-directional data strobe to clock data to and from the memory device. The data strobe is clocked at the same time as the data and propagates over a bus which is designed to be substantially the same length and have the same capacitive loading as the data bus to minimize skew between the data strobe and the data signals.

However, like the SDRAM, the DDR SDRAM exhibits a relatively slow DRAM latency for activating the DRAM bank (row-to-column delay time "$t_{RCD}$") and accessing data from the sense amplifiers (column address strobe "CAS" latency). Since burst read data is accessed from the sense amplifiers, the row must remain activated until the burst is completed. This increases the latency to access another row on the next burst. The combination of long row access latency ($t_{RCD}$+CAS latency) together with long page miss latency (precharge time "$t_{RP}$" plus tRCD and CAS latency) results in poor bus efficiency when frequent page misses on random accesses occur. In addition, the current DDR SDRAM requires the bus to be idle (or unused) during all DRAM refresh operations thereby further degrading performance.

SUMMARY OF THE INVENTION

To ameliorate these conditions, a new DDR SDRAM architecture is disclosed herein that combines the benefits of Enhanced Memory Systems, Inc. EDRAM® architecture with that of a DDR SDRAM input/output architecture to effectively double peak bandwidth and maximize sustained bandwidth under normal random access conditions. In a preferred embodiment disclosed herein, the present invention proposes the use of a conventional four memory bank DDR SDRAM architecture with the addition of a row register cache (for example SRAM) per bank. A separate data path is provided in each bank to move write data directly to the DRAM sense amplifiers.

Particularly disclosed herein is a double data rate synchronous dynamic random access memory device having data, data strobe and address bus inputs thereto. The memory device comprises one or more memory arrays each having an associated sense amplifier, a designated row in a selected one or more of the memory arrays being accessed in accordance with address signals provided to one or more row decoders coupling each of the memory arrays to the address bus. One or more column decoders, each being associated with one or more of the memory arrays are coupled to receive the address signals for accessing a designated column in the selected one or more of the memory arrays. One or more caches, are respectively interposed between one of the column decoders and one or more of the memory arrays, whereby data to be written to the memory device on the data input is directed to the selected ones of the memory arrays and data to be read from the memory device is read from the caches in accordance with the address signals on the address bus.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein.

DESCRIPTION OF A PREFERRED EMBODIMENT

Figure 1:
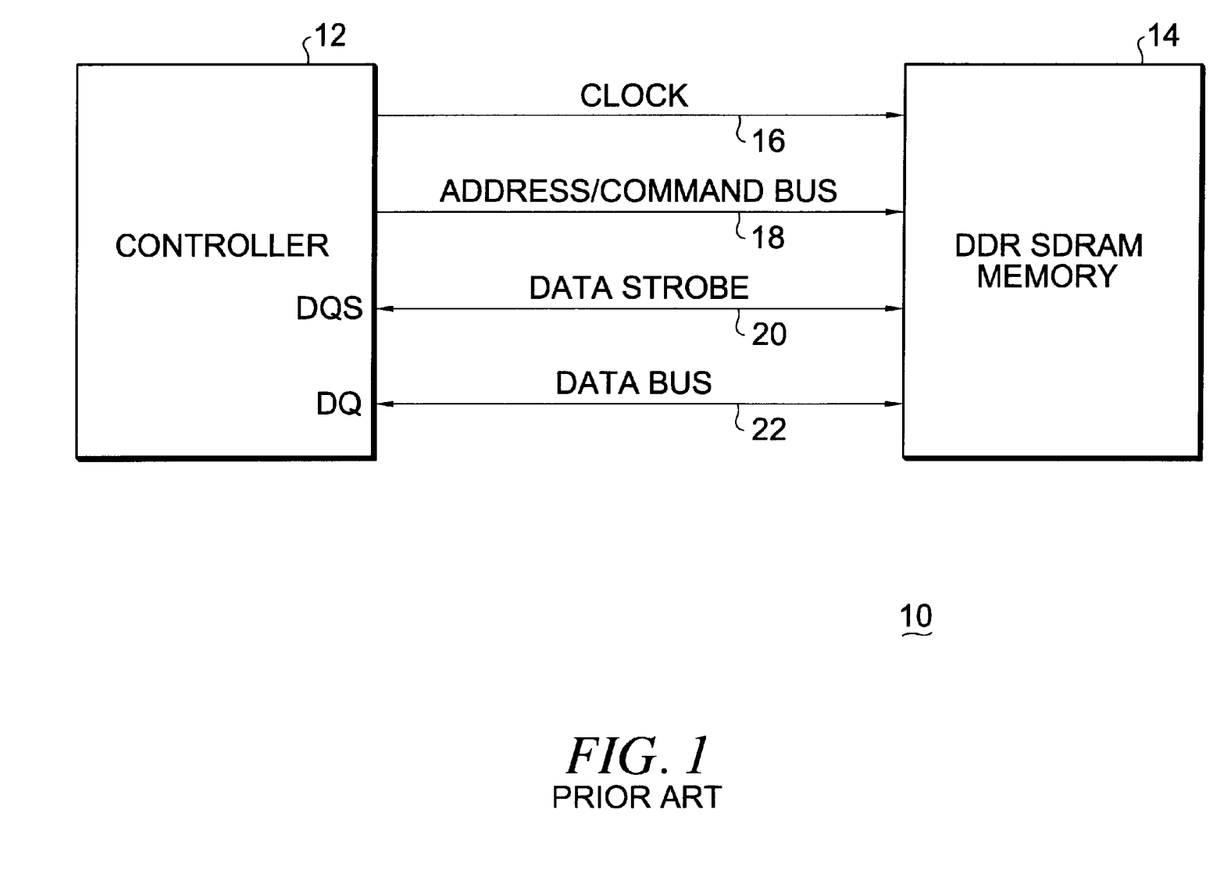
FIG. 1 illustrates a memory system including certain ones of the signals lines and buses coupling a memory controller and a conventional DDR SDRAM memory inclusive of a differential clock and address/command bus as well as bi-directional data and data strobe buses.

With reference now to FIG. 1, a high level view of a Joint Electron Device Engineering Counsel ("JEDEC") Standard memory system 10 including certain ones of the signals lines and buses coupling a memory controller 12 and a conventional DDR SDRAM memory 14 is shown. As shown, differential clock signals on clock lines 16 as well as address and command signals on address/command bus 18 are supplied from the memory controller 12 to the DDR SDRAM memory 14. In addition, a bi-directional data bus strobe ("DQS") line 20 and data ("DQ") bus 22 intercouple the memory controller 12 and the DDR SDRAM memory 14.

As shown, the DDR SDRAM memory 14 includes clock inputs 16 that synchronizes all data transfers and includes a data bus 22 whereby data may be moved bi-directionally between the controller 12 and DDR SDRAM 14. The bi-directional data strobe line 20 is unique to DDR SDRAMs and the transfers of data on the data bus 22 are synchronized to the signals on the data strobe line 20 rather than the clock signal on clock line 16. The purpose of the data strobe line 20 is to account for the propagation delays of the signals between the controller 12 and the memory 14 so that the effect of those delays can be nullified which then improves the ability to clock the memory 14 at higher speeds.

In operation, the memory latency problems inherent in DRAM devices become even more pronounced in conventional DDR SDRAM devices due to the fact that a normal memory request from a computer (including the memory system 10) includes a random access to a given location in memory, followed by (typically) a burst of four words from that location in memory, followed by another random reference. As a consequence, if typical DRAM latency is not improved, then the effective bandwidth of the memory system 10 utilizing a conventional DDR SDRAM 14 is not essentially improved at all due to the fact that after the burst of four words, the memory system 10 must wait for the next random access to occur, which might occur only after a number of clock cycles.

Figure 2:
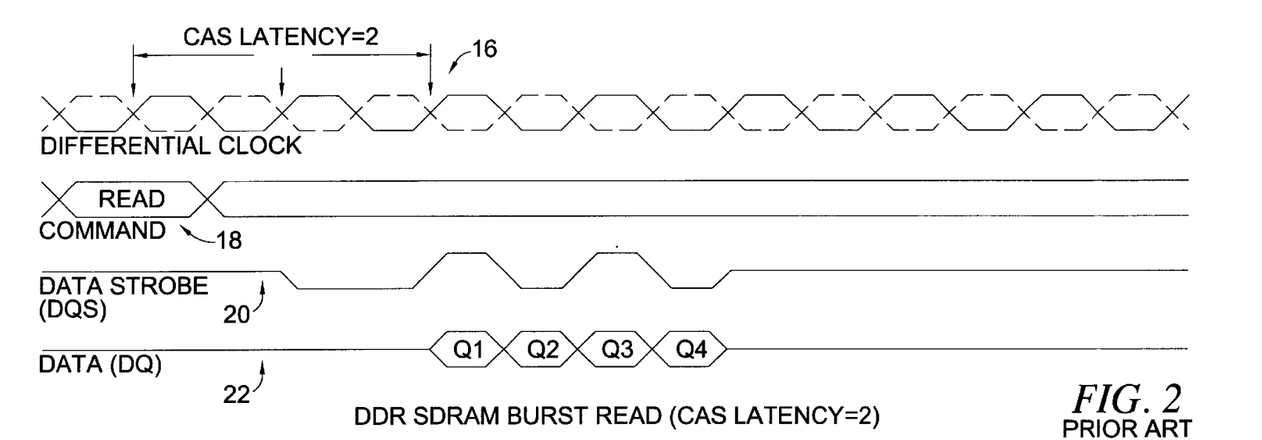
FIG. 2 illustrates the signals which might appear on the signal lines and buses shown in FIG. 1 in response to a DDR SDRAM four word burst read operation illustrating a column address strobe ("CAS") latency of 2.

With reference additionally now to FIG. 2, a timing diagram of a conventional DDR SDRAM 14 burst read is shown with a CAS latency of 2. CAS latency is defined as the delay from the time a read command is issued to time when the first read data is presented on the data bus 22. As shown, the clocking signals on the clock lines 16 are a differential clock, that is, the clock signal and its inversion are both sent to the memory 14 to enable a more precise control of the clock timing. In this manner, the point at which the clock signals cross over is where the clock occurs, and in the example shown, a read command is placed on the address/command bus 18 along with the column address which specifies that portion of the memory 14 to be accessed. Following that, the data strobe line 20 is asserted, (which has not been activated prior to the read command) and goes to a stable value which, in the example shown, is a logic low.

The data on the data bus 22 is then clocked on the rising and falling edges of the data strobe signal on the data strobe line 20. At the end of the data burst, the data bus 22 and the data strobe line 20 become high Z, or deactivated so that another memory 14 can access the data bus 22. It should be noted that the amount of time from when the read command is issued until the first data strobe signal occurs is roughly two clock cycles from the read command, resulting in a CAS latency of 2, which, in a DDR SDRAM 14 is a programmable feature.

Figure 3:
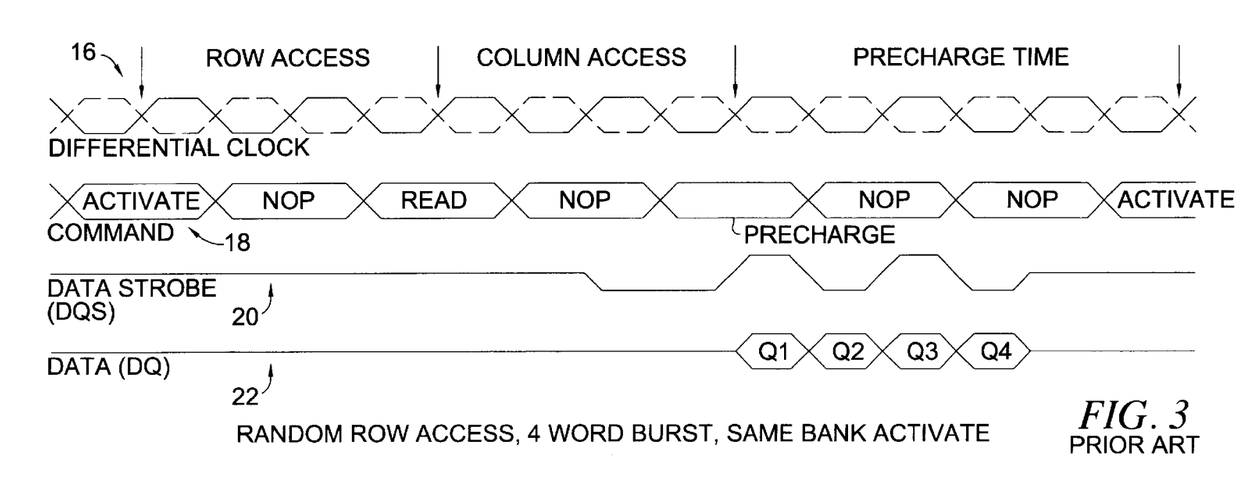
FIG. 3 is a corresponding illustration of the signals which might appear on the corresponding signal lines for a random row access, four word burst and same bank activate operation demonstrating the latency inherent in such an operation in conventional DDR SDRAMs.

With reference additionally now to FIG. 3, an entire random row access with a four word burst and a same bank activate for a conventional DDR SDRAM 14 is shown. In this example, an activate command enables the DDR SDRAM 14 and a row address is sent to the row decoder at the same time to select one of the locations in the DDR SDRAM 14. Then a delay occurs (no operation "NOP"), from the initial activate command until the read command occurs to allow the data to be accessed from the DDR SDRAM 14 and placed into the sense amplifiers. Once the read command is issued, the corresponding column address is specified so the address comes in, goes to the column decoder, column decoder then selects a pair of the locations in the DDR SDRAM to be output. In the example shown, a four-word burst is illustrated so that just four data words will be transferred on the data bus 22.

In a conventional DDR SDRAM, the memory data must be held in the sense amplifiers (where the data then resides) while data is being bursted to the data bus 22 and, as a consequence, the precharge command cannot be issued until the last data word enters the data pipeline. Then a delay from the precharge command ("NOP") must occur until the next bank activate command can be issued thereby defining the precharge time. It can be seen that the overall latency then consists of the row access time, the column access time and the precharge time which, in a conventional DDR SDRAM cannot be completely hidden. In other words, the latency time is much longer that the time actually required to transfer the two (or four) data words. Consequently, a conventional DDR SDRAM 14 is not particularly efficient in this regard.

Figures 4, 4A:
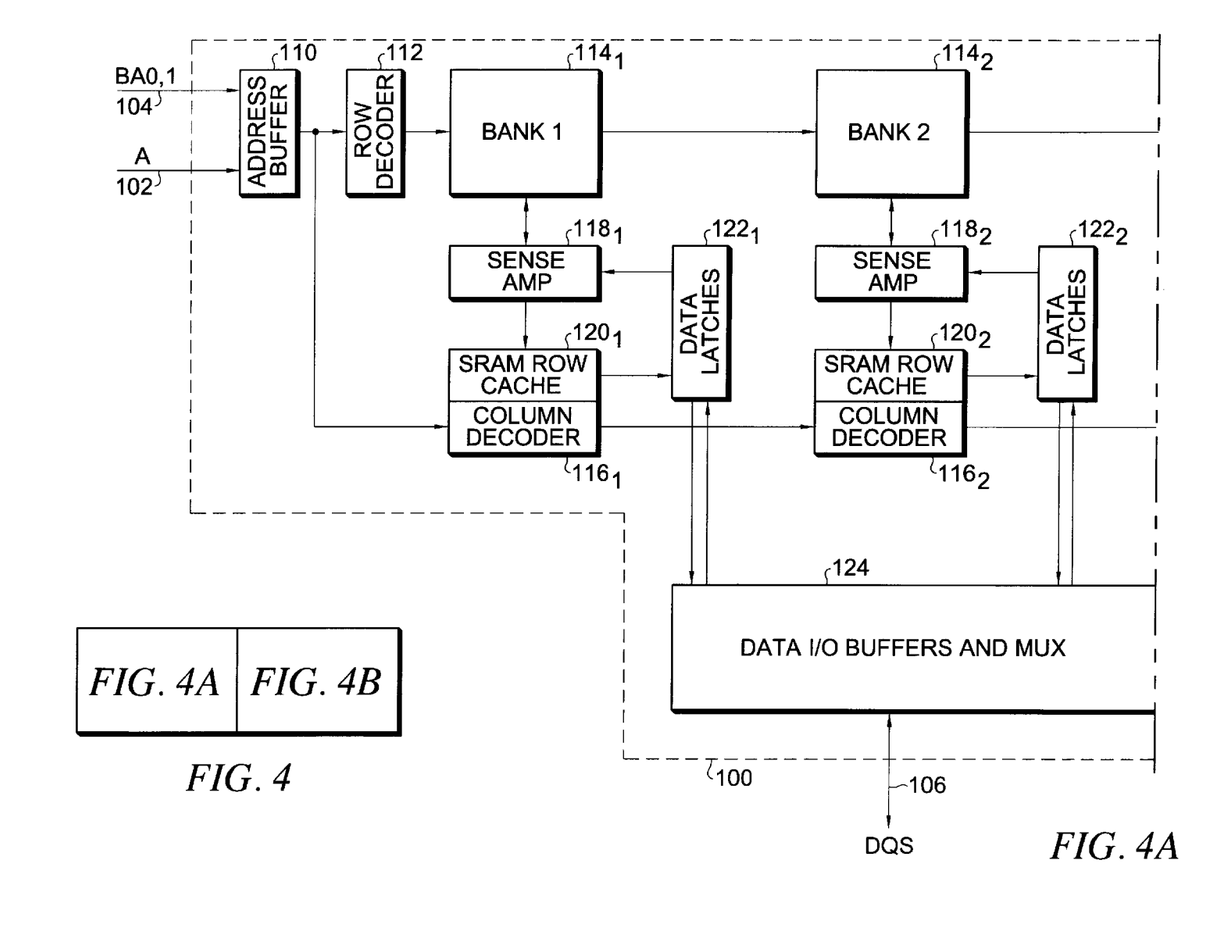
FIG. 4 is a representative functional logic block diagram of a double data rate synchronous dynamic random access memory device in accordance with the present invention which incorporates a static random access memory cache per memory bank illustrating, for purposes of example only, a device incorporating four DRAM memory arrays and their corresponding SRAM row caches.
Figure 4B:
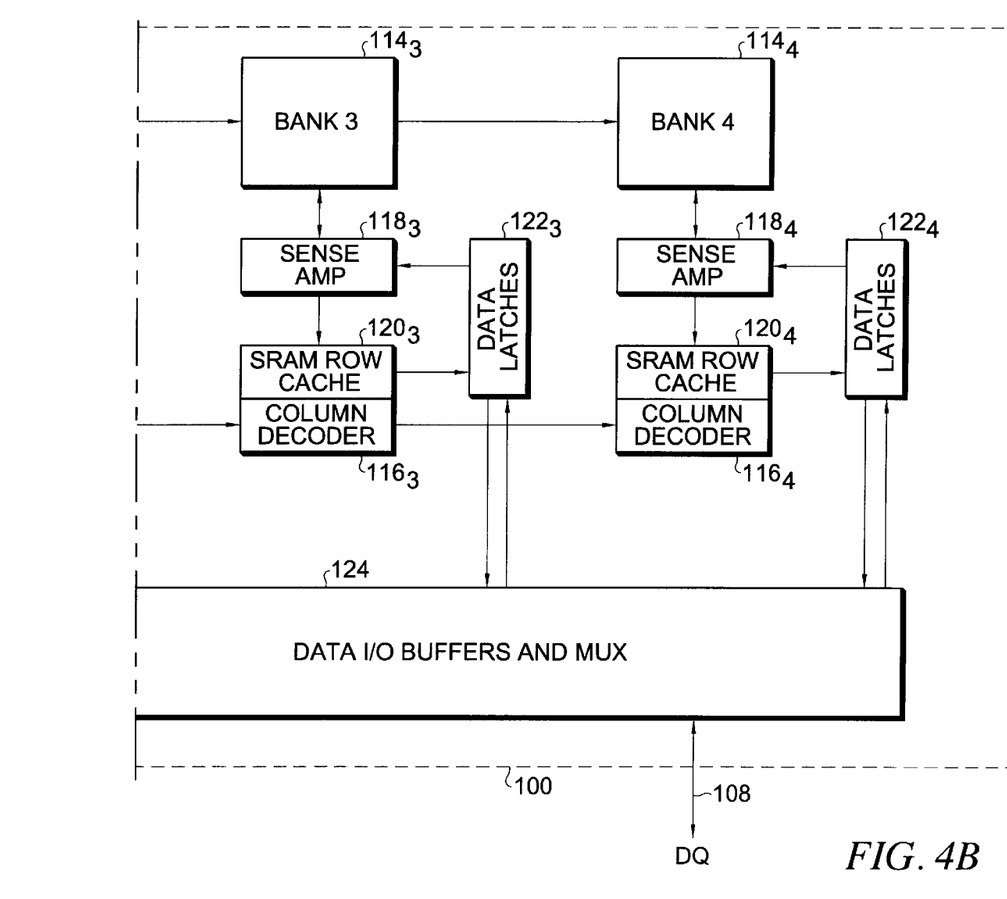

With reference additionally now to FIG. 4, a functional logic block diagram of a double data rate synchronous dynamic random access memory device 100 in accordance with the present invention is shown which incorporates a static random access memory cache 120 per memory bank 114. In the embodiment illustrated for purposes of example only, a device 100 incorporating four DRAM memory arrays $114_1$–$114_4$ and their corresponding SRAM row caches $120_1$–$120_4$ is shown.

Specifically, the memory device 100 may include an address bus 102 (A) and bank select lines 104 (BA0,1) corresponding to the address portion of the address/command bus 18 utilized in conjunction with a conventional DDR SDRAM 14 as previously described. Moreover, the memory device 100 may further include a bi-directional data strobe line 106 ("DQS") and data bus 108 ("DQ") for interfacing with a controller (not shown).

The address bus 102 and bank select lines 104 are input to an address buffer 110 which supplies output address signals to a common row decoder 112 and individual column decoders $116_1$–$116_4$ corresponding to each of the memory banks $114_1$–$114_4$. A sense amplifier $118_1$–$118_4$ and SRAM row cache $120_1$–$120_4$ couples the column decoders $116_1$–$116_4$ to its corresponding memory bank $114_1$–$114_4$. A data latch $122_1$–$122_4$ respectively couples the data I/O buffers and multiplexer ("mux") 124 (coupled to the data strobe line 106 and data bus 108) to the sense amplifiers $118_1$–$118_4$ and receives data from the respective SRAM row caches $120_1$–$120_4$.

Functionally, an SRAM row cache 120 is in the path from the sense amplifiers 118 to the associated data latch 122 and then from there the data is moved to the data I/O buffers 124. This has the effect of buffering the data from the DRAM memory banks 114 allowing faster access to the data randomly within the cache 120. It also has the effect of allowing the data that's in the sense amplifiers 118 to be stored back into the DRAM memory banks 114 concurrently with the accessing of data from the cache 120.

All writes go from the input pins of the memory device 100 to the data latch 122, to the sense amplifiers 118, and then basically the data is stored into the DRAM memory banks 114 from there. Logic on the chip (not shown) determines the data that is currently being held in the SRAM cache 120 and, if the data that is in the sense amplifiers 118 matches that in the corresponding cache 120, then that data is also written in parallel into the cache 120 over the normal read path. This then has the effect of allowing a faster random access time on reads, hidden precharge time, hidden bank activation timing, and hidden refresh timing as will be more fully described hereinafter.

During memory bank 114 activation, the row address input from the address buffer 110 is decoded by the row decoder 112 to select the DRAM row of the bank $114_1$–$114_4$ specified by the bank select signal BA0,1 on bank select lines 104. The DRAM row data is latched into the sense amplifier 118 of the specified memory bank 114. During a read command, the column address is transferred from the address buffer 110 to the corresponding column decoder $116_1$–$116_4$. The read command opens the selected SRAM row cache 120 and the sense amplifier 118 contents are loaded into the cache 120 in parallel. The column decoder 116 selects the specified starting address to the data latches 122. The read command then loads a number of words from the row cache 120 to the data latch 122 twice as wide as the output data bus 108 (for example, 32 bits read from the cache 120 for a 16-bit output data bus 108). This double wide transfer provides the data bandwidth to support the requirements of the DDR SDRAM data I/O buffers 124 and logic.

Figure 5:
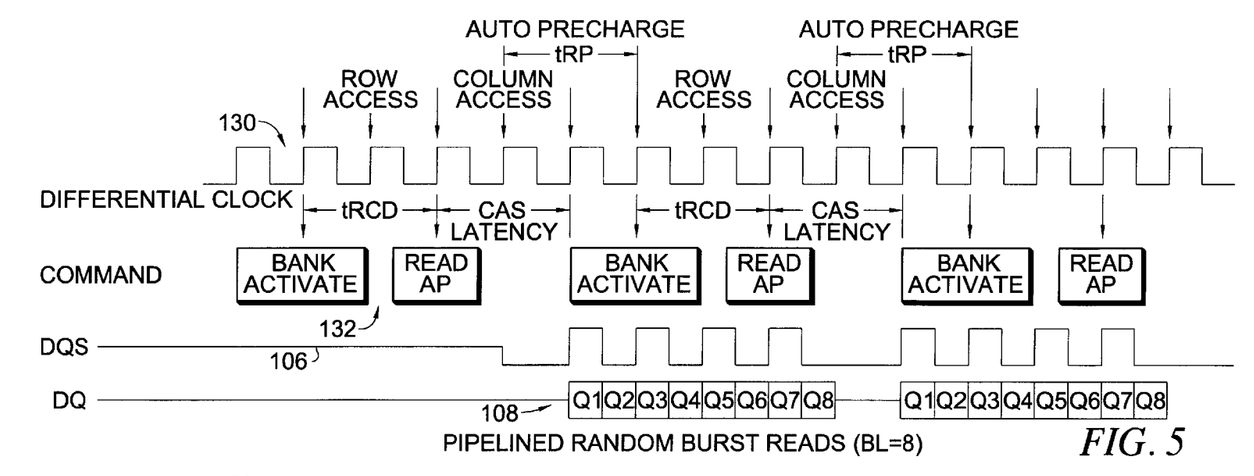
FIG. 5 illustrates the signals which might appear on the differential clock line, command, data strobe and data buses between a memory controller and a memory device in accordance with the present invention illustrating a series of pipelined random burst read operations with a bit length ("BL") of 8.

With reference additionally now to FIG. 5, representations of the signals which might appear on the differential clock line 130 command bus 132, data strobe line 106 and data bus 108 between a memory controller (not shown) and a memory device 100 in accordance with the present invention during a series of illustrative pipelined random burst read operations with a burst length ("BL") of 8 are shown. As shown, the memory device 100 of the present invention includes differential clock signals 130 which are the same as that utilized in conjunction with a conventional DDR SDRAM 14 (FIG. 1) but is shown here as a single signal with rising and falling edges for sake of clarity. During read burst operations, the burst address counter (not shown) built into the column decoder $116_1$–$116_4$ increments every clock cycle transferring two words to the corresponding data latch $122_1$–$122_4$. Data words are transferred to the data I/O buffers 124 on both the clock rising and falling edges to double the burst data rate.

The sense amplifier $118_1$–$118_4$ data is latched into the associated SRAM row cache $120_1$–$120_4$ one cycle after the read command is issued. If the read is performed with auto-precharge, the sense amplifier 1181-1184 data is automatically restored to the DRAM bank $114_1$–$114_4$ row one cycle after the read and the DRAM memory bank $114_1$–$114_4$ is ready for further bank activation after the precharge time ($t_{RP}$). Once the DRAM bank $114_1$–$114_4$ is precharged, the memory device 100 can perform either another memory bank 114 activation to fetch another row to the sense amplifiers 118 or an auto-refresh command can be issued to refresh the DRAM array memory banks 114. In either case, the presence of the SRAM row cache $120_1$–$120_4$ associated with each of the memory banks $114_1$–$114_4$ respectively allows the latency of precharge, bank activation or refresh to be hidden during burst reads from the SRAM cache 118. This improves the bus efficiency of the memory device 100 under random access and refresh conditions.

Another important feature of the memory device 100 of the present invention is observed during write operations. During writes, data is latched into the data latch 122 on the rising and falling edges of the clock (i.e. double data rate). Data is written into the row of data already stored in the sense amplifiers $118_1$–$118_4$ following the falling edge. The data word transferred to the sense amplifiers $118_1$–$118_4$ is twice as large as the data I/O buffers 124 (for example, 32-bit wide write for 16-bit data I/O buffers) to support the write bandwidth of the memory device 100.

In operation, a bank activate command initiates a row access (designated $t_{RCD}$), and a CAS latency from the read command (Read Auto-Precharge "AP") corresponds to a column access. The memory device 100 of the present invention provides the capability to enable an early auto-precharge operation of the DRAM memory banks $114_1$–$114_4$ starting one differential clock cycle after a read command is issued, during which time the data from the sense amplifiers $118_1$–1184 is loaded to the associated SRAM row caches $120_1$–$120_4$. Once the data is latched into the row cache 120, the precharge of the associated DRAM memory bank 114 can begin. As a consequence, the precharge operation can occur while the data is propagating to the memory device 100 output and, unlike a conventional DDR SDRAM 14 (FIG. 1), the precharge operation is complete (i.e. "hidden") during the output of the first two data words. In operation, the data transfer may be observed to occur with the transfer of the first data word on the rising edge following a column access latency, the second data word on the following falling edge and so forth.

The memory device 100 of the present invention is also operative to effectively hide the row access time latency with read burst lengths of, for example, eight. This can be visualized as when a row of memory is activated within the same memory bank 114 by inputting another row address, activating the row decoder 112, fetching another location within the same memory bank 114 and moving that data to the sense amplifier 118 while the burst of eight data words is being output from the associated SRAM row cache 120. This then allows for the concurrent fetching of another row of data into the sense amplifiers 118 and having that data ready prior to the completion of the bursting of eight data words from the associated SRAM row cache 120 to minimize the latency from one random access to another by reducing it to just the column access latency. In effect then, this serves to eliminate the precharge and row access latencies inherent in conventional DDR SDRAMs 14 (FIG. 1).

Figure 6:
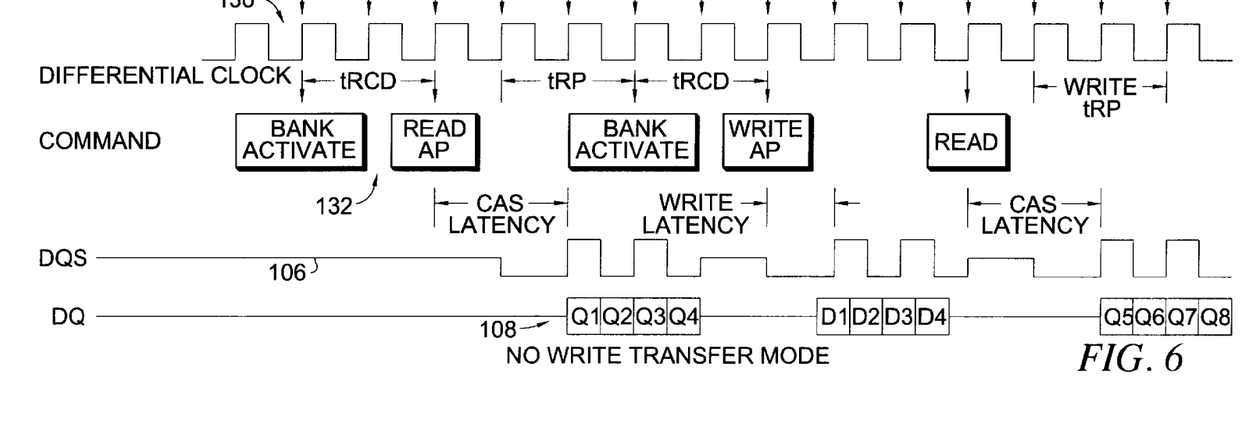
FIG. 6 is a corresponding illustration of the same signals for a memory device in accordance with the present invention in a "no write transfer" mode of operation.

With reference additionally now to FIG. 6, the memory device 100 may also have an optional "no write transfer" mode of operation. In this mode, the row data in the sense amplifiers $118_1$–$118_4$ is not written into the associated row cache $120_1$–$120_4$ on the write command. This allows data to be written only to the DRAM memory banks $114_1$–$114_4$ during a write "miss" (i.e. a write to a different row address from that currently held in the corresponding cache $120_1$–$120_4$). A comparator (not shown) on the memory device 100 automatically causes the appropriate cache $120_1$–$120_4$ to be written at the same time as the sense amplifier $118_1$–$118_4$ when a write "hit" (i.e. a write to the same row address as that currently held in the corresponding cache $120_1$–$120_4$) is detected.

The "no write transfer" feature allows a read "hit" to occur one cycle after the end of the write burst and the write data can be automatically restored to the DRAM memory bank $114_1$–$114_4$ in parallel with this read burst if a write auto-precharge is executed. This "no write transfer" mode of operation then effectively eliminates a portion of page miss latency on the initial opening of the write page and a complete page miss latency during a return to the original read page that follows a write or write burst. This feature further improves bus efficiency on write cycles.

In operation, the initiation of the memory device 100 access begins in a manner similar to that shown in the preceding FIG. 5 with a bank activate command, a delay due to a row access, and then a read auto-precharge command. As before, the hidden precharge operation can occur one cycle after the read command, with a burst of four data words from the SRAM cache $120_1$–$120_4$. In this example, instead of issuing another read command in parallel with the burst of data that is being output, a page is enabled to allow writes to it.

As can be seen, one cycle after the read auto-precharge command, the precharge operation begins. The precharge time is then met, and then another bank activate command with a row address is specified, which in the example shown, is a write row address with auto-precharge after the row-to-column delay is met. At this point, the data is now in the sense amplifiers 118 and it can be modified by the write cycle. As shown, the write auto-precharge command may be issued by the associated controller (not shown) a cycle before the data. The first data word is generated on a rising edge of the differential clock signal, the second data word on the falling edge and so forth and by completing an early precharge operation and an early memory bank 114 activation, the normal latency of a conventional DDR SDRAM 14 (FIG. 1) has been significantly reduced. At this point, the write burst basically occurs as it would in a conventional DDR SDRAM 14 although if the next request is another read request to the same data that was previously held in the SRAM row cache 120, (writes to the memory device 100 are to the DRAM sense amplifiers 118 and reads are from the SRAM row caches 120) the data is still held from the previous read command in the SRAM row cache 120 in the "no-write transfer" mode of operation. Therefore, if the data is still in the SRAM row cache 120, the read command can be initiated while the write data is being input to the memory device 100 allowing the CAS latency to occur with minimum delay because there is no need to wait for the data in the memory banks 114 to be precharged and the write data precharge can occur later.

Due to the inherent functionality of DRAMs, the final data word ("D4") must be written to the sense amplifiers during the following cycle before the auto-precharge can occur. In a conventional DDR SDRAM 14 (FIG. 1) a number of wait states would have to be entered until the write precharge operation has been completed, followed by another random read, (involving issuing bank activate and read commands) before the next data could be made available.

Therefore, through the particular functionality of the memory device 100 of the present invention, the write precharge time may be effectively "hidden" and the need for another row activate command eliminated due to the fact that the data was held in the SRAM row cache 120 during this transfer thereby eliminating all of the conventional latency inherent in a read command following a write. In effect, two sources of conventional latency have been eliminated, one on the write cycle following a read, and another on a read "hit" that follows a write.

The sustained bandwidth for a memory device 100 in accordance with the present invention is 80% of the peak bandwidth for random access burst reads (BL=8) when $t_{RC}=5*t_{CLKmax}$. In contrast, for a typical DDR SDRAM 14 (FIG. 1), where $t_{RC}=10*t_{CLKmax}$, the effective bandwidth is $t_{RC}+4*t_{CLKmax}$. This results in twenty wait states for eight data transfers and the sustained bandwidth is 29% of the peak bandwidth. It can be seen that the combination of the memory device 100 faster $t_{RC}$, pipelined precharge and bank activate latency improves efficiency over the conventional DDR SDRAM 14 (FIG. 1) data bus 22 from 29% to 80%.

Data bus 108 efficiency for a memory device 100 in "no write transfer mode" in accordance with the present invention is twenty data transfers for 24 clock edges, or 83% for BL=8 reads and BL=4 writes. For a slower, typical DDR SDRAM 14 (FIG. 1) with a write setup of ($t_{RP}+tR_{CD}+1$ CLK) and read setup of (1 CLK+$t_{RC}$) only twenty data transfers for 56 clock edges can be achieved resulting in a data bus 22 efficiency of only 36%. A memory device 100 in accordance with the present invention implementing a "no write transfer" mode of operation then further improves data bus efficiency from 36% to 83%.

What has been provided, therefore is an enhanced DDR SDRAM architecture for a memory device 100 that provides effectively double peak data bandwidth, optimizes sustained bandwidth and improves bus efficiency when compared with conventional DDR SDRAM devices. Among the benefits are: effectively faster DRAM memory basic parameters ($t_{RCD}$, CAS latency, $t_{RP}$, $t_{RC}$ etc.), faster page hit latency, faster page miss latency and sustained bandwidth on random burst reads, faster read-to-write latency and write-to-read latency, hidden precharge, hidden bank activate latency, hidden refresh and hidden write precharge during a read "hit".

While there have been described above the principles of the present invention in conjunction with a specific device architecture, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

What is claimed is:

1. A double data rate synchronous dynamic random access memory device having data, bi-directional data strobe and address bus inputs thereto, said device comprising:
   one or more memory arrays each having an associated sense amplifier, a designated row in a selected one or more of said memory arrays being accessed in accordance with address signals provided to one or more row decoders coupling each of said one or more memory arrays to said address bus;
   one or more column decoders, each of said column decoders being associated with one or more of said memory arrays and coupled to receive said address signals for accessing a designated column in said selected one of said one or more, memory arrays;
   a plurality of data latches for storing data to be written to said selected one or more of said memory arrays and said data to be read from said one or more of said caches;
   a data input and output buffer coupled to the bi-directional data strobe inputs and to the data latches; and
   one or more caches, each of said caches being interposed between one of said column decoders and one or more of said memory arrays and coupled to the data latches, whereby data buffering is performed as said data to be written to said device on said data input is directed to said selected ones of said memory arrays and data to be read from said device is read from said caches in accordance with said address signals on said address bus;
      wherein the data input and output buffer is synchronously operated for clocking data on the data inputs on a rising edge and a falling edge of a data strobe signal on the bi-directional data strobe inputs.

2. The memory device of claim 1 further comprising an address buffer coupling said address bus to said row decoders and said column decoders.

3. The memory device of claim 1 wherein said address bus comprises a bank select input for indicating selected set of said decoders, caches and memory arrays.

4. The memory device of claim 1 wherein said memory arrays comprise arrays of dynamic random access memory cells.

5. The memory device of claim 1 wherein said caches each comprise a row of static random access memory cells.

6. The memory device of claim 5 wherein said rows of static random access memory cells correspond in width to said rows in said plurality of memory arrays.

7. The memory device of claim 1 wherein said one or more memory arrays comprises four memory banks.

8. The memory device of claim 1 wherein said data to be written to said selected one or more of said memory arrays may additionally be selectively written or not written substantially concurrently to an associated one of said caches.

9. A memory device, comprising:
   a column decoder for receiving address signals;
   a dynamic random access memory (DRAM) bank for storing data;
   a sense amplifier bi-directionally coupling the column decoder to the DRAM bank;
   data input and output buffers for receiving and outputting data from devices external to the memory device;
   a bi-directional data strobe line coupled to the data input and output buffers for transmitting a data strobe signal with a rising edge and a falling edge based on an external clock to the data input and output buffers for use by the memory device synchronizing transfers of data;
   a data bus coupled to the data input and output buffers and providing an interface with a memory controller;
   a data latch coupling the data input and output buffers to the sense amplifier, wherein the data latch is configured to transfer data to and from the data input and output buffers and to the sense amplifier; and
   a static random access memory (SRAM) row cache coupled with and interposed between the data latch, the sense amplifier, and the column decoder, wherein the SRAM row cache is configured for receiving and storing data from the sense amplifier and transmitting the stored data to the data latch,
      wherein the memory device is operable to concurrently transfer the sense amplifier data to the DRAM bank and to access the SRAM row cache data via the data latch, and
      wherein data transfer between the data bus and the data input and output buffers is clocked on the rising edge and the falling edge of the data strobe signal on the bi-directional data strobe signal line.

10. The memory device of claim 9, wherein during a read command operation of the memory device, a number of words of data twice as wide as the data bus are loaded from the SRAM row cache to the data latch.

11. The memory device of claim 9, further including an address buffer and a row decoder, and wherein during activation of the DRAM bank the memory device operates to decode a row address from the address buffer to select a DRAM row of the DRAM bank and to latch the selected DRAM row into the sense amplifier.

12. The memory device of claim 11, wherein during a read command after the activation, the memory device operates to transfer a column address from the address buffer to the column decoder, to open the SRAM row cache, to load the sense amplifier data into the SRAM row cache, to operate the column decoder to specify a starting address to the data latches, and then load a number of words of data from the SRAM row cache to the data latch.

13. The memory device of claim 9, wherein the sense amplifier data is latched into the SRAM row cache one cycle after a read command.

14. The memory device of claim 9, wherein the memory device is operable during write operations to latch write data into the data latch on the rising edge and the falling edge of the data strobe signal.

15. The memory device of claim 14, wherein the write data is written from the data latch into a row of data previously stored in the sense amplifier following the falling edge of the data strobe signal and wherein the write data has a size that is twice as large as a buffer in the data input and output buffers.

16. The memory device of claim 9, wherein the memory device is operable to perform precharge operation of the DRAM bank starting one differential clock cycle after a read command, and wherein during the one differential clock cycle sense amplifier data is loaded into the SRAM row cache.

17. The memory device of claim 9, wherein the memory device is configured to operate in a no-write-transfer mode in which row data in the sense amplifier is not written into the SRAM row cache on a write command, whereby write data is written to the DRAM bank only during a write miss.

18. The memory device of claim 17, wherein the memory device operates to cause the write data to be concurrently written to the sense amplifier and the SRAM row cache upon determination of a write hit.

* * * * *